(12) United States Patent
Terashima et al.

(10) Patent No.: US 6,452,112 B1
(45) Date of Patent: Sep. 17, 2002

(54) ELECTRONIC CIRCUIT UNIT USEFUL FOR PORTABLE TELEPHONE, ETC., AND A METHOD OF MANUFACTURING THE SAME

(75) Inventors: Kiminori Terashima; Hiroshi Harada, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/420,292

(22) Filed: Oct. 18, 1999

(30) Foreign Application Priority Data

Oct. 19, 1998 (JP) .......................................... 10-296973

(51) Int. Cl.⁷ ................................................ H05K 1/16
(52) U.S. Cl. ...................... 174/260; 174/262; 174/263; 361/768; 361/771
(58) Field of Search ................................ 174/260, 262, 174/263; 361/760, 766, 772, 767, 768, 769, 770, 771, 807, 808

(56) References Cited

U.S. PATENT DOCUMENTS 4,790,894 A 12/1988 Homma et al.
5,724,728 A * 3/1998 Bond et al. .................... 29/840

FOREIGN PATENT DOCUMENTS

| GB | 1565748 | 4/1980 |
| JP | 05206606 | 8/1993 |
| JP | Hei 5-327156 | * 12/1993 |
| JP | 06 334064 | 12/1994 |
| JP | 07 122846 | 5/1995 |
| JP | 07212104 | 8/1995 |

* cited by examiner

*Primary Examiner*—Kamand Cuneo
(74) *Attorney, Agent, or Firm*—Brinks Hofer Gilson & Lione

(57) ABSTRACT

The electronic circuit unit of the present invention is provided with the broad width lands and the thin width lands tied with the broad width lands, which are configured by a solder resist that is formed on the surface of the circuit board. Owing to this configuration, the solders placed on the thin width lands are drawn toward the broad width lands, which increases the quantity of the solder buildup on the broad width lands, and accompanied with this increase, swells the heights of the solder buildup on the broad width lands. Thus, the electronic circuit unit of the present invention ensures the soldering.

5 Claims, 3 Drawing Sheets

ELECTRONIC CIRCUIT UNIT USEFUL FOR PORTABLE TELEPHONE, ETC., AND A METHOD OF MANUFACTURING THE SAME

BACKGROUND OF THE INVENTION

1. Field of the Invention

The present invention relates to an electronic circuit unit suitable for use in portable telephones or the like, and a method of manufacturing the same.

2. Description of the Related Art

The conventional electronic circuit unit will be explained with reference to FIG. 6 and FIG. 7. A circuit board 21 has a plurality of cutout sections 21b formed on the end faces 21a thereof and conductive patterns 22 formed on the upper side thereof, and on the cutout sections 21b are formed end-face electrodes 23 that are connected to the conductive patterns 22.

Further, electronic components (not illustrated) such as resistors, capacitors, and the like are mounted on the circuit board 21 in a state that the electronic components are connected to the conductive patterns 22, and thus an electronic circuit unit 24 is configured with the one circuit board 21.

Further, as shown in FIG. 7, a printed board 25 serving as a mother board includes conductive wiring patterns 26 formed on the surface thereof and a plurality of lands 27 for soldering, which are formed on the ends of the conductive wiring patterns 26.

And, as shown in FIG. 7, the electronic circuit unit 24 is mounted on the printed board 25 as the mother board of the portable telephone or the like, and the end-face electrodes 23 provided on the circuit board 21 of the electronic circuit unit 24 are bonded onto the lands 27 provided on the printed board 25 through solders 28, whereby the electronic circuit unit 24 is connected to the conductive wiring patterns 26 on the printed board 25, and at the same time it is mounted to the printed board 25.

With regard to the method for mounting the electronic circuit unit 24 to the printed board 25, first, cream solders (not illustrated) are applied on the lands 27, as shown in FIG. 7.

Next, the electronic circuit unit 24 is mounted on the printed board 25 in a state that the end face electrodes 23 are located on the cream solder, and the printed board 25 having the electronic circuit unit 24 mounted in this state is carried into a heating furnace, whereby the cream solder is melted to bond the end face electrodes 23 to the lands 27 through the solder 28.

However, in these mounting structure and method, since the soldering is made with the cream solder applied on the lands 27 on the printed board 25, this method is difficult to make sufficient buildup of the solders 28, and also difficult to secure good wettability of the solders 28 to the end-face electrodes 23.

Further, when the circuit board 21 is warped due to a temperature variation, aged deterioration, or the like, both ends of the circuit board 21 are lifted up as shown in FIG. 7; and especially in such a warped circuit board 21, the cream solder is difficult to wet the end face electrodes 23.

Thus, in the conventional electronic circuit unit, since the soldering is made with the cream solder applied on the lands 27 on the printed board 25, sufficient buildup of the solder 28 is difficult to be made, so that good wettability of the solders 28 to the end face electrodes 23 cannot be achieved, which is a problem to be solved.

Further, with regard to the circuit board 21 having a warp, the wettability of the cream solder to the end face electrodes 23 becomes still worse, which is another problem.

SUMMARY OF THE INVENTION

In a first embodiment to solve the foregoing problem, the electronic circuit unit of the present invention assumes a configuration containing a circuit board having conductive patterns on one face thereof and conductive lands connected to the conductive patterns on the other face thereof, in which electronic components such as resistors and capacitors, etc., connected to the conductive patterns are mounted on one face of the circuit board, a solder resist is provided on the other face of the circuit board, the lands are made up with broad width lands exposed from the solder resist and one or more thin width lands tied with the broad width lands in a state of being exposed from the solder resist, and the broad width lands have solder buildup formed thereon.

in a second embodiment to solve the problem, the electronic circuit unit of the present invention takes on circular broad width lands.

Further, as a third embodiment to solve the problem, the electronic circuit unit of the present invention takes on a configuration such that the broad width lands are formed near the end faces of the circuit board.

Further, as a forth embodiment to solve the problem, in the method of manufacturing an electronic circuit unit of the present invention, the electronic circuit unit is configured with a circuit board having conductive patterns on one face thereof and conductive lands connected to the conductive patterns on the other face thereof, in which electronic components such as resistors and capacitors, etc., connected to the conductive patterns are mounted on the one face of the circuit board, a solder resist is provided on the other face of the circuit board, and the lands are made up with broad width lands exposed from the solder resist and one or more thin width lands tied with the broad width lands in a state of being exposed from the solder resist. With this configuration, the method of the present invention comprises the steps of: applying cream solder on the broad width lands and the solder resist surrounding thereof, and on the thin width lands and the solder resist surrounding thereof, thereafter, at least heating the cream solder, and forming solder buildups on the broad width lands.

Further, as a fifth embodiment to solve the problem, the method of the present invention takes on circular broad width lands.

Further,as a sixth embodiment to solve the problem, the method of the present invention takes on a configuration such that the broad width lands are formed near the end faces of the circuit board.

DETAILED DESCRIPTION OF THE PREFERRED EMBODIMENTS

Figure 1:
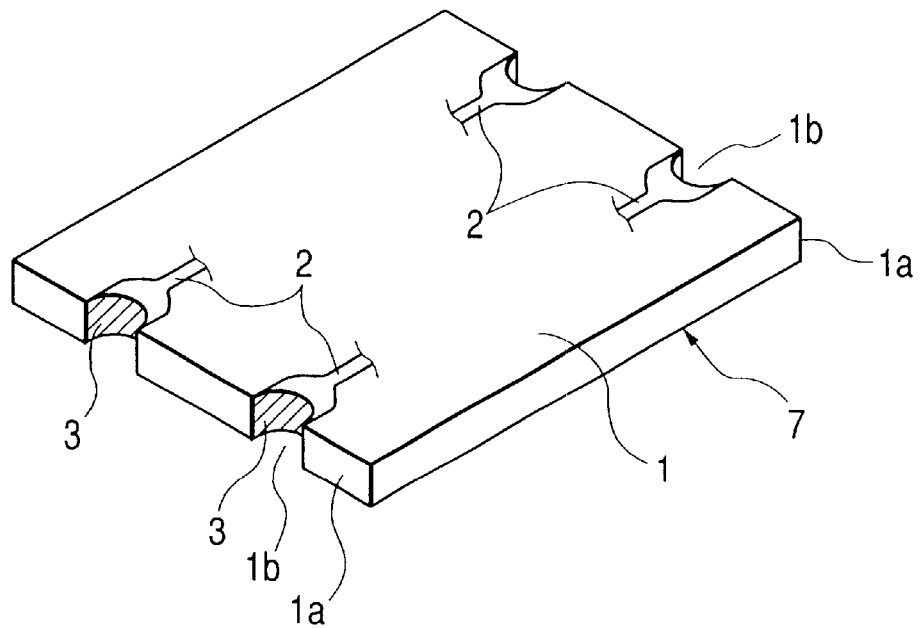
FIG. 1 is a perspective view from the upper side of an electronic circuit unit of the present invention.
Figure 2:
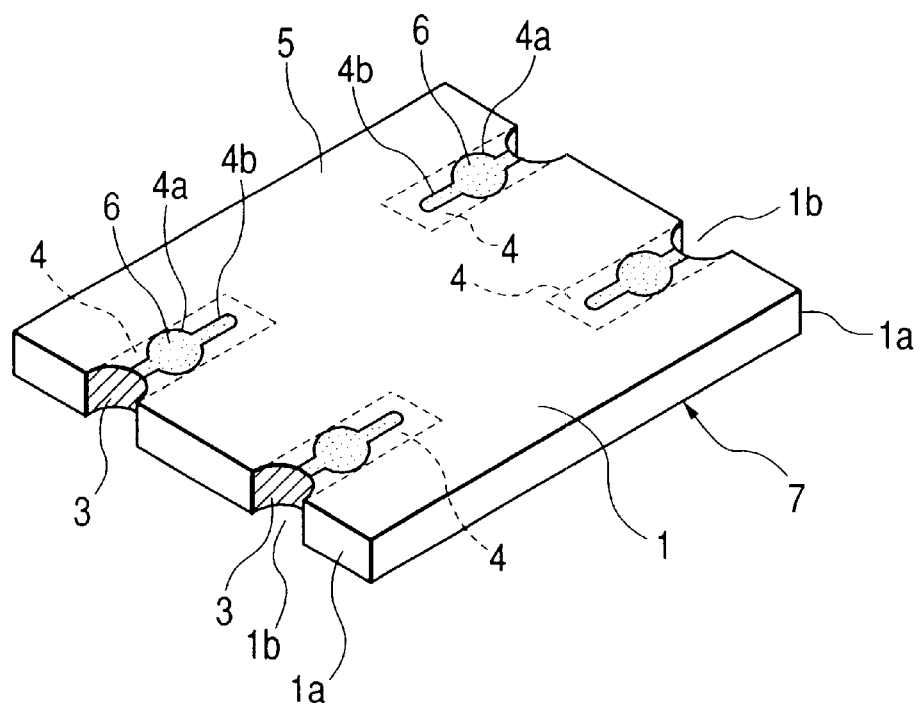
FIG. 2 is a perspective view from the lower side of the electronic circuit unit of the present invention.
Figure 3:
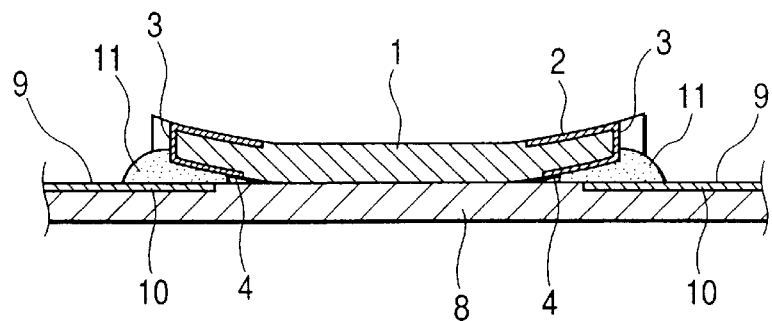
FIG. 3 is a sectional view to show a structure for mounting the electronic circuit unit to the printed board of the present invention.
Figure 4:
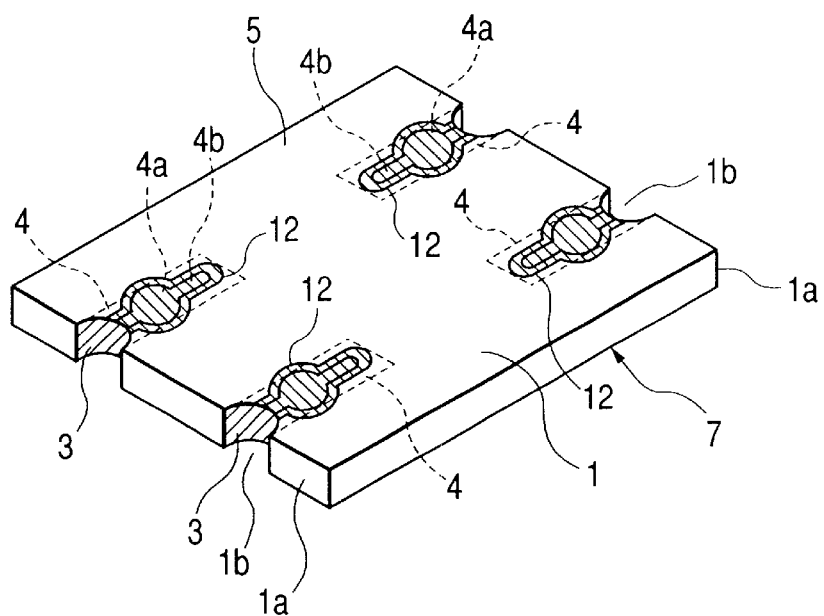
FIG. 4 is an illustration to explain a method of manufacturing the electronic circuit unit of the present invention.
Figure 5:
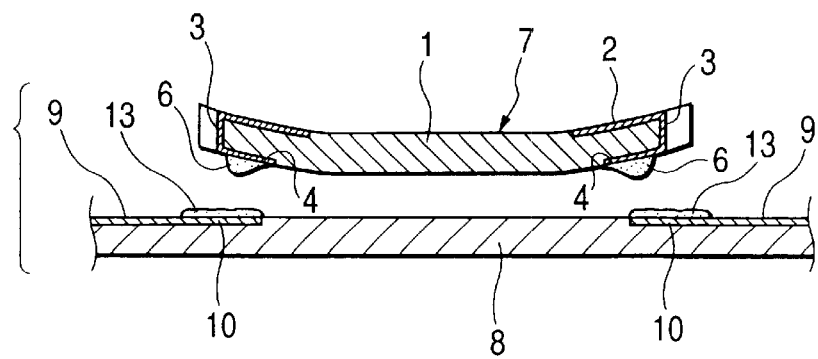
FIG. 5 is an illustration to explain a method of mounting the electronic circuit unit to the printed board of the present invention.
Figure 6:
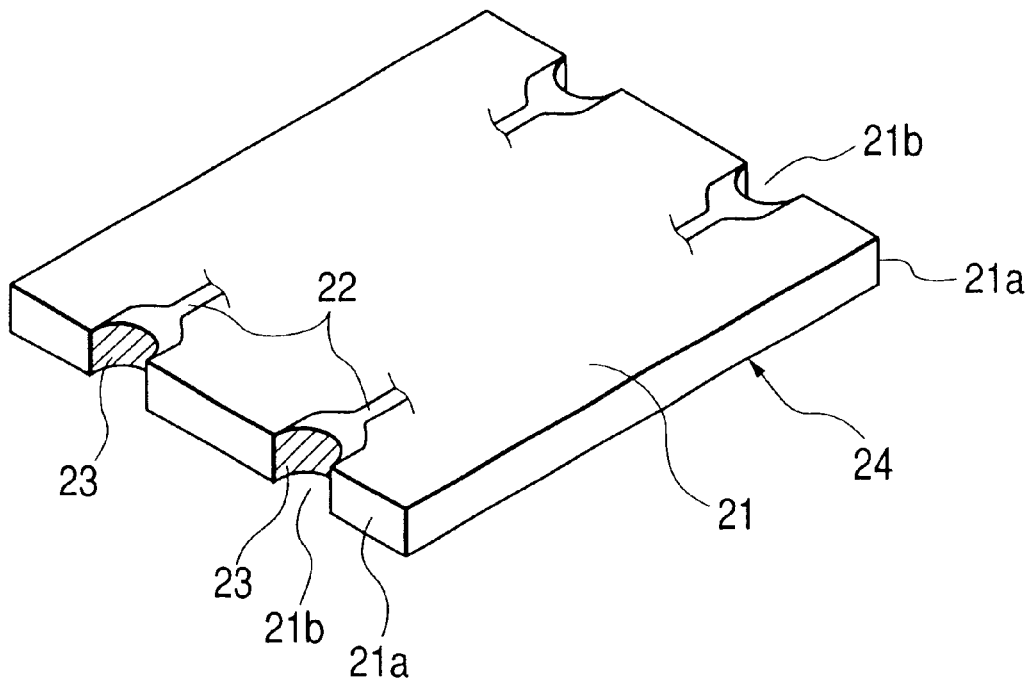
FIG. 6 is a perspective view from the upper side of a conventional electronic circuit unit.
Figure 7:
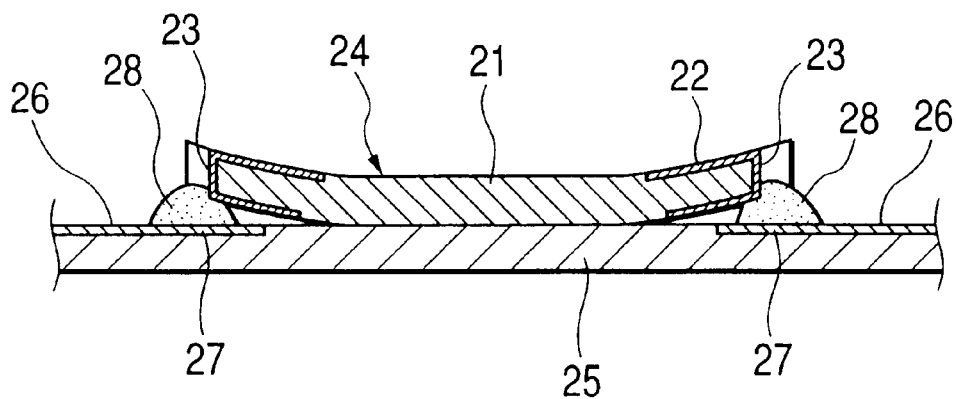
FIG. 7 is a sectional view to show a conventional structure for mounting the electronic circuit unit to the printed board.

To describe an electronic circuit unit and a method of manufacturing the electronic circuit unit of the present invention, the following drawings are provided: FIG. 1 is a perspective view from the upper side of the electronic circuit unit of the present invention, FIG. 2 is a perspective view from the lower side of the electronic circuit unit of the present invention, FIG. 3 is a sectional view to show a structure for mounting the electronic circuit unit to the printed board of the present invention, FIG. 4 is an illustration to explain a method of manufacturing the electronic circuit unit of the present invention, FIG. 5 is an illustration to explain a method of mounting the electronic circuit unit to the printed board of the present invention.

Next, the electronic circuit unit and the method of manufacturing the electronic circuit unit of the present invention will be discussed with reference to FIG. 1 through FIG. 5. A circuit board 1 configured with one or plural sheets has a plurality of cutout sections 1b formed on end faces 1a thereof. The circuit board 1 has conductive patterns 2 formed on the upper side thereof, and also end face electrodes 3 connected with the conductive patterns 2 are formed on the cutout sections 1b.

Further, conductive lands 4 connected with the end faces 3 are formed on the lower side of the circuit board 1.

And, a solder resist 5 is formed on the surface of the lower side of the circuit board 1 including the conductive lands 4 by means of printing or the like. And, on the surface of the lands 4, circular broad width lands 4a exposed from the solder resist 5 and thin width lands 4b tied with the broad width lands 4a, being exposed from the solder resist 5 are configured by means of this solder resist 5.

Further, the broad width lands 4a may be elliptical, rectangular, polygonal, or the like, and the number of the thin width lands 4b may be one or more for each of the lands 4.

And, the broad width lands 4a are formed near the end faces 1a of the circuit board 1, and on the broad width lands 4a are formed solder buildups 6, as shown in FIG. 2, FIG. 5.

Further, electronic components (not illustrated) such as resistors, capacitors, and the like are mounted on the circuit board 1 in a state that they are connected to the conductive patterns 2, and thus an electronic circuit unit 7 is configured with one circuit board 1.

On the other hand, as shown in FIG. 3, a printed board 8 serving as the mother board has conductive wiring patterns 9 formed on the surface thereof and a plurality of lands 10 for soldering formed on the ends of the conductive wiring patterns 9.

And, as shown in FIG. 3, the electronic circuit unit 7 is mounted on the printed board 8 as the mother board of the portable telephone or the like, and the lands 4 provided on the circuit board 1 of the electronic circuit unit 7 are bonded onto the lands 10 provided on the printed board 8 through solder 11, thus the electronic circuit unit 7 is connected to the conductive wiring patterns 9 on the printed board 8, and at the same time it is fixed to the printed board 8.

With regard to the method of manufacturing the electronic circuit unit 7, first, cream solders 12 are applied on the broad width lands 4a and the solder resist 5 surrounding thereof, and on the thin width lands 4b and the solder resist 5 surrounding thereof, as shown in FIG. 4.

Next, the electronic circuit unit 7 thus prepared is put into a heating furnace, whereby the cream solder 12 are melted to form the solder buildup 6 on the broad width lands 4a, thus completing the manufacturing of the electronic circuit unit 7.

In this manufacturing process, as the cream solder 12 is melted in the heating furnace, the cream solder 12 is placed on the solder resist 5 surrounding the thin width lands 4b is drawn toward the thin width lands 4b, and at the same time, the cream solders 12 placed on the thin width lands 4b are drawn toward the broad width lands 4a by surface tension, which increases the quantity of the solder buildup 6 on the broad width lands 4a and swells the heights of the solder buildups 6.

Further, the cream solder 12 is placed on the solder resist 5 surrounding the broad width lands 4a are drawn toward the broad width lands 4a, which increases the quantity of the solder buildup 6 on the broad width lands 4a as well as the thin width lands 4b, and further swells the heights of the solder buildup 6.

Next, the method of mounting the electronic circuit unit 7 to the printed board 8 will be explained. First, as shown in FIG. 5, cream solder 13 is applied on the lands 10 of the printed board 8.

Next, the circuit board 1 is mounted on this printed board 8 thus prepared in a state that the solder buildup 6 is located on the cream solder 13, and the printed board 8 with the circuit board 1 thus mounted is put into a heating furnace to melt the cream solder 13 and the solder buildup 6. Thereby, the electronic circuit unit 7 is mounted to the printed board 8.

In the foregoing mounting method, since the quantity of solder on the solder buildup 6 of the electronic circuit unit 7 is ample and the heights of the solder buildups 6 are sufficient, even if there occur lift-ups on the both ends of the circuit board 1, resulting from a warp of the circuit board 1 by the influence of a temperature variation, aged deterioration, or the like, the wettability of the solders 11 between the lands 4 and the lands 10 on the printed board 8 can be made satisfactory and reliable.

According to the electronic circuit unit of the present invention, the solder resist 5 formed on the surface of the printed board 1 configures the broad width lands 4a and the thin width lands 4b linked with the broad width lands 4a, whereby the cream solder 12 is placed on the thin width lands 4b are drawn toward the broad width lands 4a to thereby increase the quantity of the solder buildup 6 on the broad width lands 4a, and accompanied with this increase, the height of the solder buildup 6 can be made bigger on the broad width lands 4a. Therefore, the present invention can provide an electronic circuit unit that ensures the soldering.

Further, even if there is a warp on the circuit board 1, since the height of the solder buildup 6 becomes bigger, the electronic circuit unit of the present invention can provide a satisfactory and reliable bonding of the solders 11 between the lands 4 on the circuit board 1 and the lands 10 on the printed board 8.

Further, by making the broad width lands 4a circular, the present invention enhances the effect of surface tension of the cream solders 12, which makes it possible to further increase the heights of the solder buildups 6; and the present invention can provide an electronic circuit unit that ensures the mounting.

Further, by forming the broad width lands 4a near the end faces 1a of the circuit board 1, the present invention can provide an electronic circuit unit that ensures the bonding of the solders 11 to a warped circuit board 11.

According to the method of manufacturing an electronic circuit unit of the present invention, the cream solder 12 is applied on the broad width lands 4a and the solder resist 5 surrounding thereof, and on the thin width lands 4b and the solder resist 5 surrounding thereof; as the cream solder 12 is melted in the heating furnace, the cream solder 12 placed on the solder resist 5 surrounding the thin width lands 4b are drawn toward the thin width lands 4b, the cream solder 12 is placed on the thin width lands 4b are drawn toward the broad width lands 4a by surface tension, and also the cream solder 12 is placed on the solder resist 5 surrounding the broad width lands 4a are drawn toward the broad width lands 4a; and therefore, the present invention can provide the method of manufacturing an electronic circuit unit, which increases the quantity of the solder buildups 6 on the broad width lands 4a as well as the thin width lands 4b, and swells the heights of the solder buildups 6.

Further, by making the broad width lands 4a circular, the present invention can provide the method of manufacturing an electronic circuit unit that enhances the effect of surface tension of the cream solders 12 to form higher solder buildup 6.

Further, by forming the broad width lands 4a near the end faces 1a of the circuit board 1, the present invention can provide the method of manufacturing an electronic circuit unit free from troubles even with a warped circuit board 1.

What is claimed is:

1. An electronic circuit unit comprising:
    a circuit board having conductive patterns formed on an upper face thereof;
    end face electrodes formed on an end face of said circuit board, said end face electrodes being connected to said conductive patterns; and
    conductive lands connected to said end face electrodes, said conductive lands being formed on a lower face of said circuit board,
    wherein electronic components of at least a resistor and a capacitor are connected to said conductive patterns and are mounted on the upper face of said circuit board,
    a solder resist is provided on the lower face of said circuit board,
    said lands each comprise a broad width land exposed from said solder resist and connected to said end face electrodes and one or more thin width lands tied with said broad width land in a state of being exposed from said solder resist, and
    said broad width land has a solder buildup formed thereon.

2. The electronic circuit unit according to claim 1, wherein said broad width land are formed circular.

3. A method of manufacturing an electronic circuit unit that includes a circuit board having conductive patterns on one face thereof and conductive lands connected to said conductive patterns on the other face thereof, in which electronic components such as resistors and capacitors, etc., connected to said conductive patterns are mounted on said one face of said circuit board, a solder resist is provided on the other face of said circuit board, and said lands are made up with broad width lands exposed from said solder resist and one or more thin width lands tied with said broad width lands in a state of being exposed from said solder resist, the method comprising the steps of: applying cream solders on said broad width lands and said solder resist surrounding thereof, and on said thin width lands and the solder resist surrounding thereof, thereafter, at least heating said cream solders, and forming solder buildup on said broad width lands.

4. The method of manufacturing an electronic circuit unit according to claim 3, wherein said broad width lands are formed circular.

5. The method of manufacturing an electronic circuit unit according to claim 3, wherein said broad width lands are formed near end faces of said circuit board.

* * * * *

UNITED STATES PATENT AND TRADEMARK OFFICE
CERTIFICATE OF CORRECTION

PATENT NO.     : 6,452,112 B1
DATED          : September 17, 2002
INVENTOR(S)    : Kiminori Terashima et al.

It is certified that error appears in the above-identified patent and that said Letters Patent is hereby corrected as shown below:

Column 6,
Line 15, delete "land" and substitute -- lands -- in its place.
Line 16, should be deleted in its entirety.
Line 34, should be deleted in its entirety.
Line 37, should be deleted in its entirety.

Signed and Sealed this

Twenty-third Day of September, 2003

JAMES E. ROGAN
*Director of the United States Patent and Trademark Office*